(12) United States Patent
Takamoto et al.

(10) Patent No.: US 9,478,454 B2
(45) Date of Patent: *Oct. 25, 2016

(54) DICING TAPE-INTEGRATED FILM FOR SEMICONDUCTOR BACK SURFACE

(71) Applicant: NITTO DENKO CORPORATION, Ibaraki-shi, Osaka (JP)

(72) Inventors: Naohide Takamoto, Osaka (JP); Goji Shiga, Osaka (JP); Fumiteru Asai, Osaka (JP); Toshimasa Sugimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/221,314

(22) Filed: Mar. 21, 2014

(65) Prior Publication Data

US 2014/0203458 A1    Jul. 24, 2014

Related U.S. Application Data

(63) Continuation of application No. 13/088,738, filed on Apr. 18, 2011, now Pat. No. 8,722,517.

(30) Foreign Application Priority Data

Apr. 19, 2010 (JP) ................. 2010-096295

(51) Int. Cl.
*H01L 21/00* (2006.01)
*H01L 21/683* (2006.01)
(Continued)

(52) U.S. Cl.
CPC .......... *H01L 21/6836* (2013.01); *C09J 7/0246* (2013.01); *H01L 21/78* (2013.01);
(Continued)

(58) Field of Classification Search
None
See application file for complete search history.

(56) References Cited

U.S. PATENT DOCUMENTS

| 5,284,796 A | 2/1994 | Nakanishi et al. |
| 7,301,222 B1 | 11/2007 | Patwardhan et al. |

(Continued)

FOREIGN PATENT DOCUMENTS

| CN | 1497703 A | 5/2004 |
| CN | 101512742 A | 8/2009 |

(Continued)

OTHER PUBLICATIONS

Office Action dated Mar. 21, 2014 issued by the State Intellectual Property Office of the People's Republic of China in Chinese Patent Application No. 201110099960.4, which corresponds to U.S. Appl. No. 13/088,737.

(Continued)

*Primary Examiner* — Reema Patel
(74) *Attorney, Agent, or Firm* — Sughrue Mion, PLLC

(57) ABSTRACT

The present invention provides a dicing tape-integrated film for semiconductor back surface, including a film for flip chip type semiconductor back surface for protecting a back surface of a semiconductor element flip chip-connected onto an adherend, and a dicing tape, the dicing tape including a base material and a pressure-sensitive adhesive layer provided on the base material, the film for flip chip type semiconductor back surface being formed on the pressure-sensitive adhesive layer, in which the pressure-sensitive adhesive layer is a radiation-curable pressure-sensitive adhesive layer whose pressure-sensitive adhesive force toward the film for flip chip type semiconductor back surface is decreased by irradiation with a radiation ray.

1 Claim, 2 Drawing Sheets

(51) Int. Cl.
*H01L 23/544* (2006.01)
*C09J 7/02* (2006.01)
*H01L 21/78* (2006.01)
*H01L 23/00* (2006.01)

(52) U.S. Cl.
CPC ....... *H01L 23/544* (2013.01); *C09J 2203/326* (2013.01); *C09J 2205/31* (2013.01); *H01L 24/16* (2013.01); *H01L 24/81* (2013.01); *H01L 2221/68327* (2013.01); *H01L 2221/68377* (2013.01); *H01L 2221/68381* (2013.01); *H01L 2223/54486* (2013.01); *H01L 2224/16225* (2013.01); *H01L 2924/12042* (2013.01); *Y10T 428/1467* (2015.01); *Y10T 428/1471* (2015.01); *Y10T 428/28* (2015.01)

(56) References Cited

U.S. PATENT DOCUMENTS

| | | | |
|---|---|---|---|
| 7,508,081 | B2 | 3/2009 | Matsumura et al. |
| 7,517,724 | B2 | 4/2009 | Hatakeyama et al. |
| 7,820,487 | B2 | 10/2010 | Teshirogi et al. |
| 7,863,182 | B2 | 1/2011 | Matsumura et al. |
| 7,935,574 | B2 | 5/2011 | Saiki et al. |
| 8,119,236 | B2 | 2/2012 | Kamiya et al. |
| 8,304,341 | B2 | 11/2012 | Matsumura et al. |
| 8,643,194 | B2 * | 2/2014 | Takamoto ............. H01L 21/561 257/778 |
| 8,722,517 | B2 * | 5/2014 | Takamoto et al. ............ 438/464 |
| 2004/0104326 | A1 | 6/2004 | Demel et al. |
| 2005/0046042 | A1 | 3/2005 | Matsumura et al. |
| 2005/0208736 | A1 | 9/2005 | Matsumura et al. |
| 2006/0079011 | A1 | 4/2006 | Tandy |
| 2006/0102987 | A1 * | 5/2006 | Saiki et al. ................... 257/632 |
| 2006/0148131 | A1 | 7/2006 | Matsumura et al. |
| 2007/0013048 | A1 * | 1/2007 | Sunohara et al. ............ 257/698 |
| 2007/0090299 | A1 | 4/2007 | Kozakai et al. |
| 2009/0053518 | A1 | 2/2009 | Saiki et al. |
| 2009/0149003 | A1 | 6/2009 | Matsumura et al. |
| 2009/0186451 | A1 | 7/2009 | Teshirogi et al. |
| 2009/0209089 | A1 | 8/2009 | Murata et al. |
| 2010/0029060 | A1 | 2/2010 | Kamiya et al. |
| 2010/0093155 | A1 | 4/2010 | Matsumura et al. |
| 2010/0193968 | A1 | 8/2010 | Takamoto et al. |
| 2010/0233409 | A1 * | 9/2010 | Kamiya et al. ............. 428/41.5 |
| 2010/0301497 | A1 * | 12/2010 | Misumi et al. ............... 257/778 |
| 2011/0104873 | A1 | 5/2011 | Kamiya et al. |
| 2011/0147952 | A1 | 6/2011 | Matsumura et al. |
| 2012/0088333 | A1 | 4/2012 | Matsumura et al. |

FOREIGN PATENT DOCUMENTS

| | | | | |
|---|---|---|---|---|
| CN | 101645425 | A | 2/2010 | |
| JP | 1-242679 | A | 9/1989 | |
| JP | 2004-063551 | A | 2/2004 | |
| JP | 2004-072108 | A | 3/2004 | |
| JP | 2004-142430 | A | 5/2004 | |
| JP | 2004-214288 | A | 7/2004 | |
| JP | 2004-221169 | A | 8/2004 | |
| JP | 2005-268434 | A | 9/2005 | |
| JP | 2008-124141 | A | 5/2006 | |
| JP | 2006-140348 | A | 6/2006 | |
| JP | 2007-158026 | A | 6/2007 | |
| JP | 2007-250970 | A | 9/2007 | |
| JP | 2007-261035 | A | 10/2007 | |
| JP | 2007-266420 | A | 10/2007 | |
| JP | 2008-006386 | A | 1/2008 | |
| JP | 2008-166451 | A | 7/2008 | |
| JP | 2008-235716 | A | 10/2008 | |
| JP | 2009-130320 | A | 6/2009 | |
| JP | 2009-170786 | A | 7/2009 | |
| JP | 2009-194303 | A | 8/2009 | |
| JP | 2010-31183 | A | 2/2010 | |
| JP | 2010-62542 | A | 3/2010 | |
| JP | 2011-159694 | A | 8/2011 | |
| KR | 10-0723980 | B1 | 6/2007 | |
| WO | 2008/038345 | A1 | 4/2008 | |
| WO | WO2009060787 | * | 5/2009 | ........ H01L 21/301 |

OTHER PUBLICATIONS

Notification dated Apr. 14, 2014 issued by the Japanese Patent Office in counterpart Japanese Patent Application No. 2010-096295.
Office Action dated May 2, 2014 issued by the Intellectual Property Office of Taiwan in Taiwanese Patent Application No. 100113597, which corresponds to U.S. Appl. No. 13/088,737.
Office Action dated Sep. 14, 2012 from the USPTO in U.S. Appl. No. 13/088,737.
Office Action dated Apr. 22, 2013 from the USPTO in U.S. Appl. No. 13/088,737.
Notification, dated Apr. 5, 2013, issued by the Japanese Patent Office in Japanese Application No. 2010-096298, which corresponds to U.S. Appl. No. 13/088,737.
Notification of Reasons for Refusal, dated Apr. 3, 2013, issued by the Japanese Patent Office in Japanese Application No. 2010-096298, which corresponds to U.S. Appl. No. 13/088,737.
Notification of Reasons for Refusal, dated for Apr. 3, 2013, issued by the Japanese Patent Office in counterpart Japanese Application No. 2010-096295.
Notification, dated for Apr. 5, 2013, issued by the Japanese Patent Office in counterpart Japanese Application No. 2010-096295.
Office Action, dated Jul. 25, 2013, issued by the State Intellectual Property Office of P.R. China in Chinese Patent Application No. 201110099960.4.
Office Action, dated Sep. 4, 2013, issued by the Japanese Patent Office, in Application No. 2010096298, which corresponds to U.S. Appl. No. 13/088,737.
Office Action, dated Sep. 24, 2013, issued by the Japanese Patent Office, in Application No. 2010096298, which corresponds to U.S. Appl. No. 13/088,737.
Office Action dated Dec. 4, 2013, issued by the Intellectual Property Office of Taiwan in Taiwanese Application No. 100113597, which corresponds to U.S. Appl. No. 13/088,737.
Office Action dated Jan. 16, 2014 issued by the Intellectual Property Office of Taiwan in Taiwanese Patent Application No. 100113596.
Office Action dated Sep. 6, 2013, issued by the Japanese Patent Office, in corresponding application No. 2010096295.
Office Action issued Jul. 15, 2014; by the State Intellectual Property Office of PR China; in Application No. 201110099946.4, which corresponds to U.S. Appl. No. 13/088,738.
Office Action issued Aug. 1, 2014; by the State Intellectual Property Office of PR China; in corresponding Application No. 201110099960.4.
Office Action dated Oct. 23, 2014 issued by the Taiwanese Patent Office in counterpart Taiwanese Patent Application No. 100113596.
Notice of Preliminary Rejection dated Nov. 12, 2014 issued by the Korean Intellectual Property Office in counterpart Korean Patent Application No. 10-2011-0035680.
Office Action dated Sep. 5, 2014 issued by the Taiwanese Patent Office in counterpart Patent Application No. 100113597.
Notification of Reexamination issued May 6, 2015, by the State IP Office of P.R. China in Application No. 201110099960.4, which corresponds to U.S. Appl. No. 13/088,737.
Office Action issued May 7, 2015, by the Taiwanese Patent Office in related Application No. 100113597, which corresponds to U.S. Appl. No. 13/088,737.
Notification of Reasons for Refusal dated Dec. 16, 2014 issued by the Japanese Patent Office in counterpart Japanese Patent Application No. 2013-271241.
Notice of Preliminary Rejection dated Mar. 10, 2015, issued by the Korean Intellectual Property Office in counterpart Korean Application No. 10-2011-0035680.
Notification of Second Office Action dated Mar. 23, 2015 issued by the State Intellectual Property Office of the People's Republic of

(56) References Cited

OTHER PUBLICATIONS

China in counterpart Chinese Patent Application No. 201110099946.4.
Office Action dated Aug. 14, 2015 issued by the Taiwanese Patent Office in counterpart Taiwanese Patent Application No. 100113596.
Notice of Final Rejection dated Jul. 6, 2015, issued by the Korean Intellectual Property Office in counterpart Korean application No. 10-2011-0035680.
Notification of Reasons for Refusal dated Jun. 19, 2015, issued by the Japanese Patent Office in counterpart Japanese Patent Application No. 2013-271241.
Reexamination Decision dated Aug. 28, 2015 issued by the State Intellectual Property Office of P.R. China in counterpart Chinese Patent Application No. 201110099960.4.
Notice of Final Rejection issued on Oct. 20, 2015 by the Korean Intellectual Property Office in Application No. 10-2011-0035680, which corresponds to U.S. Appl. No. 13/088,738.
Decision of Dismissal of Amendment dated Jan. 26, 2016, issued by the Japanese Patent Office in counterpart Japanese Application No. 2013-271241.
Final Rejection dated Jan. 26, 2016, issued by the Japanese Patent Office in counterpart Japanese Application No. 2013-271241.
Trial Board Decision from the Korean Intellectual Property Office dated Mar. 23, 2016 in a Korean application No. 10-2011-0035680.
Notice of Preliminary Rejection from the Korean Intellectual Property Office dated Apr. 1, 2016 in a Korean application No. 10-2015-0163192.
Notice of Preliminary Rejection dated Jul. 6, 2016 issued by the Korean Intellectual Property Office in counterpart Korean Patent Application No. 10-2011-0035688.

\* cited by examiner

⇧ ⇧ ⇧ ⇧ ⇧ ⇧
RADIATION RAY

DICING TAPE-INTEGRATED FILM FOR SEMICONDUCTOR BACK SURFACE

This is a continuation of application Ser. No. 13/088,738 filed Apr. 18, 2011, which claims priority based on Japanese patent application No. 2010-096295 filed Apr. 19, 2010, the entire contents thereof being hereby incorporated by reference.

FIELD OF THE INVENTION

The present invention relates to a dicing tape-integrated film for semiconductor back surface having a film for flip chip type semiconductor back surface. The film for flip chip type semiconductor back surface is used for protecting a back surface of a semiconductor element such as a semiconductor chip and enhancing strength. Moreover, the invention relates to a process for producing a semiconductor device using the dicing tape-integrated film for semiconductor back surface and a flip chip-mounted semiconductor device.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where a circuit face of the semiconductor chip is opposed to an electrode-formed face of the substrate. In such a semiconductor device or the like, there may be a case where the back surface of the semiconductor chip is protected with a protective film to prevent the semiconductor chip from damaging or the like (see, Patent Document 1 to 10).

Patent Document 1: JP-A-2008-166451
Patent Document 2: JP-A-2008-006386
Patent Document 3: JP-A-2007-261035
Patent Document 4: JP-A-2007-250970
Patent Document 5: JP-A-2007-158026
Patent Document 6: JP-A-2004-221169
Patent Document 7: JP-A-2004-214288
Patent Document 8: JP-A-2004-142430
Patent Document 9: JP-A-2004-072108
Patent Document 10: JP-A-2004-063551

However, in order to protect a back surface of a semiconductor chip by the protective film, it is necessary to add a new step for attaching the protective film to the back surface of the semiconductor chip obtained in a dicing step. As a result, the number of steps increases and production cost and the like increase. Accordingly, for the purpose of reducing the production cost, the present inventors have developed a dicing tape-integrated film for semiconductor back surface. The dicing tape-integrated film for semiconductor back surface has a structure including a dicing tape having a base material and a pressure-sensitive adhesive layer on the base material, and a film for flip chip type semiconductor back surface formed on the pressure-sensitive adhesive layer of the dicing tape. At the production of the semiconductor device, the dicing tape-integrated film for semiconductor back surface is used as follows. First, a semiconductor wafer is attached onto the film for flip chip type semiconductor back surface in the dicing tape-integrated film for semiconductor back surface. Next, the semiconductor wafer is diced to form a semiconductor element. Subsequently, the semiconductor element is peeled from the pressure-sensitive adhesive layer of the dicing tape and picked up together with the film for flip chip type semiconductor back surface and then the semiconductor element is flip chip-connected onto an adherend such as a substrate. Consequently, a flip chip type semiconductor device is obtained. However, in the dicing tape-integrated film for semiconductor back surface described in the above, in the case where close adhesiveness of the pressure-sensitive adhesive layer with the film for flip chip type semiconductor back surface is high, picking-up of the semiconductor element becomes difficult in some cases.

With regard to the picking-up property of the semiconductor element, the present inventors have further developed a dicing tape-integrated film for semiconductor back surface including a pressure-sensitive adhesive layer cured beforehand by irradiation with a radiation ray. Since this dicing tape-integrated film for semiconductor back surface exhibits a good peeling property between the pressure-sensitive adhesive layer and the film for flip chip type semiconductor back surface at the picking-up of the semiconductor element without irradiation with a radiation ray, the picking-up property is improved. Furthermore, since a step of irradiation with a radiation ray is unnecessary, the number of production steps for producing a semiconductor device can be decreased and also the production cost can be reduced.

However, in such a dicing tape-integrated film for semiconductor back surface described in the above, since the pressure-sensitive adhesive layer has been radiation-cured beforehand, the close adhesiveness between the pressure-sensitive adhesive layer and the film for flip chip type semiconductor back surface is low. Therefore, for example, there is a problem that chip fly and chipping of the semiconductor element occur at dicing of the semiconductor wafer. In addition, there is also a problem that cutting water used at dicing penetrates between the pressure-sensitive adhesive layer and the film for flip chip type semiconductor back surface.

The present invention has been made in consideration of the foregoing problem and an object thereof is to provide a dicing tape-integrated film for semiconductor back surface capable of preventing the occurrence of chip fly and chipping of the semiconductor element at the dicing of the semiconductor wafer and the penetration of cutting water used in the dicing between the pressure-sensitive adhesive layer and the film for flip chip type semiconductor back surface while maintaining a good peeling property at the picking-up of the semiconductor element, and a process for producing a semiconductor device.

In order to solve the foregoing problems, the present inventors made extensive and intensive investigations. As a result, it has been found that the foregoing problems can be solved by adopting the following configuration, thereby leading to accomplishment of the invention.

Namely, the present invention provides a dicing tape-integrated film for semiconductor back surface, comprising a film for flip chip type semiconductor back surface for protecting a back surface of a semiconductor element flip chip-connected onto an adherend, and a dicing tape, the dicing tape comprising a base material and a pressure-sensitive adhesive layer provided on the base material, the film for flip chip type semiconductor back surface being formed on the pressure-sensitive adhesive layer, wherein the pressure-sensitive adhesive layer is a radiation-curable pressure-sensitive adhesive layer whose pressure-sensitive adhesive force toward the film for flip chip type semiconductor back surface is decreased by irradiation with a radiation ray.

According to the foregoing configuration, since the close adhesiveness between the pressure-sensitive adhesive layer and the film for flip chip type semiconductor back surface is good, for example, the occurrence of chip fly and chipping of the semiconductor element at the dicing of the semiconductor wafer can be prevented. Here, at the dicing, for example, the semiconductor wafer is cut by rotating a dicing blade or the like at high speed, and the cutting is generally performed with spraying cutting water on the cutting part for cooling and preventing flying of cut swarf. According to the invention, since the close adhesiveness between the pressure-sensitive adhesive layer and the film for flip chip type semiconductor back surface is good, it is possible to prevent the cutting water from penetrating between the both. Furthermore, in the foregoing configuration, since a radiation-curable type pressure-sensitive adhesive layer is used as the pressure-sensitive adhesive layer, decrease in the pressure-sensitive adhesive force toward the film for flip chip type semiconductor back surface can be achieved by irradiating the pressure-sensitive adhesive layer with a radiation ray immediately before picking-up of the semiconductor element, for example. Consequently, at the picking-up of the semiconductor element together with the film for flip chip type semiconductor back surface, the picking-up can be well performed without generating adhesive residue. Incidentally, the back surface of the semiconductor element means a face (non-circuit face) opposite to the circuit-formed face (circuit face).

The film for flip chip type semiconductor back surface preferably contains a colorant. Owing to this constitution, the film for flip chip type semiconductor back surface can have a function of exhibiting an excellent laser marking property and an excellent appearance property. As a result, for example, marking can be performed to impart various kinds of information such as literal information and graphical information to the face on the non-circuit side of the semiconductor element or a semiconductor device using the semiconductor element by utilizing any of various marking methods such as a printing method and a laser marking method through the film for flip chip type semiconductor back surface. Moreover, the film for flip chip type semiconductor back surface and the dicing tape can be easily distinguished from each other and hence workability and the like can be enhanced.

Furthermore, the present invention also provides a process for producing a semiconductor device using the above-mentioned dicing tape-integrated film for semiconductor back surface, the process comprising:

attaching a semiconductor wafer onto the film for flip chip type semiconductor back surface in the dicing tape-integrated film for semiconductor back surface, dicing the semiconductor wafer to form a semiconductor element, irradiating the pressure-sensitive adhesive layer in the dicing tape-integrated film for semiconductor back surface with a radiation ray from the base material side, peeling the semiconductor element from the pressure-sensitive adhesive layer of the dicing tape together with the film for flip chip type semiconductor back surface, and flip chip-connecting the semiconductor element onto the adherend.

According to the process, the semiconductor wafer is attached onto the film for flip chip type semiconductor back surface in the dicing tape-integrated film for semiconductor back surface, and the semiconductor wafer is diced in a state that the back surface of the semiconductor wafer is protected. On this occasion, since the pressure-sensitive adhesive layer is not cured beforehand by irradiation with a radiation ray or the like, the close adhesiveness with the film for flip chip type semiconductor back surface is in a good state. Therefore, the occurrence of chip fly and chipping of the semiconductor element can be prevented. Moreover, at the dicing, cutting water is sprayed for cooling and prevention of the flying of cut swarf. According to the foregoing process, since the close adhesiveness between the pressure-sensitive adhesive layer and the film for flip chip type semiconductor back surface is good, the dicing can be performed while preventing the cutting water from penetrating between the both.

Furthermore, in the above-mentioned process, the pressure-sensitive adhesive force toward the film for flip chip type semiconductor back surface is decreased by irradiating the pressure-sensitive adhesive layer with a radiation ray from the base material side. Consequently, the semiconductor element can be easily picked up from the pressure-sensitive adhesive layer of the dicing tape together with the film for flip chip type semiconductor back surface without generating adhesive residue. Namely, according to the production process, the chip fly and chipping of the semiconductor element and the penetration of the cutting water between the pressure-sensitive adhesive layer and the film for flip chip type semiconductor back surface are prevented at the dicing step and also it becomes possible to well pick up the semiconductor element at the picking-up step.

Moreover, the present invention also provides a flip chip type semiconductor device which is manufactured by the process for producing a semiconductor device as described in the above.

According to the invention, in the dicing tape-integrated film for semiconductor back surface including a dicing tape including a base material and a radiation-curable pressure-sensitive adhesive layer on the base material, and a film for flip chip type semiconductor back surface formed on the pressure-sensitive adhesive layer, since a radiation-curable pressure-sensitive adhesive layer whose pressure-sensitive adhesive force toward the film for flip chip type semiconductor back surface can be decreased by irradiation with a radiation ray is adopted as the pressure-sensitive adhesive layer, picking-up of a semiconductor element can be well performed by irradiating the pressure-sensitive adhesive layer with a radiation ray before the picking-up (particularly, at the picking-up). Moreover, since the close adhesiveness between the pressure-sensitive adhesive layer and the film for flip chip type semiconductor back surface is good in a state that the pressure-sensitive adhesive layer is not irradiated with a radiation ray, the occurrence of chip fly and chipping of the semiconductor element can be prevented at dicing of a semiconductor wafer. Furthermore, at the dicing, cutting water is sprayed for cooling and prevention of the flying of cut swarf, but the penetration of the cutting water between the pressure-sensitive adhesive layer and the film for flip chip type semiconductor back surface can also be prevented. Namely, according to the configuration of the invention, it is possible to provide a dicing tape-integrated film for semiconductor back surface capable of exhibiting a good peeling property at the picking-up while preventing the chip fly and chipping of the semiconductor element at dicing and the penetration of the cutting water between the pressure-sensitive adhesive layer and the film for flip chip type semiconductor back surface.

Figure 1:
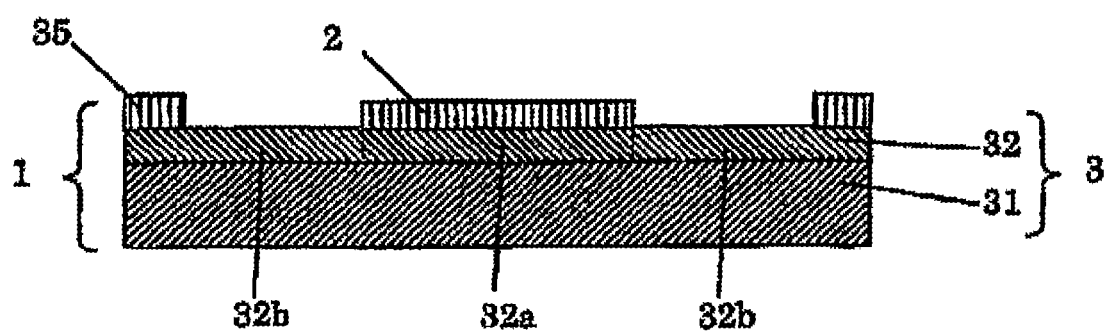
FIG. 1 is a cross-sectional schematic view showing one embodiment of a dicing tape-integrated film for semiconductor back surface of the invention.

DESCRIPTION OF REFERENCE NUMERALS AND SIGNS 1, 11 Dicing tape-integrated film for semiconductor back surface
2, 12 Film for semiconductor back surface
3 Dicing tape
4 Semiconductor wafer
5 Semiconductor chip
6 Adherend
12a Semiconductor wafer-adhering part
12b Part other than semiconductor wafer-adhering part
31 Base material
32 Pressure-sensitive adhesive layer
32a Part corresponding to semiconductor wafer-adhering part
32b Part other than part corresponding to semiconductor water-adhering part
51 Bump formed at circuit face side of semiconductor chip 5
61 Conductive material for conjunction adhered to connecting pad of adherend 6

BEST MODE FOR CARRYING OUT THE INVENTION

Figure 2:
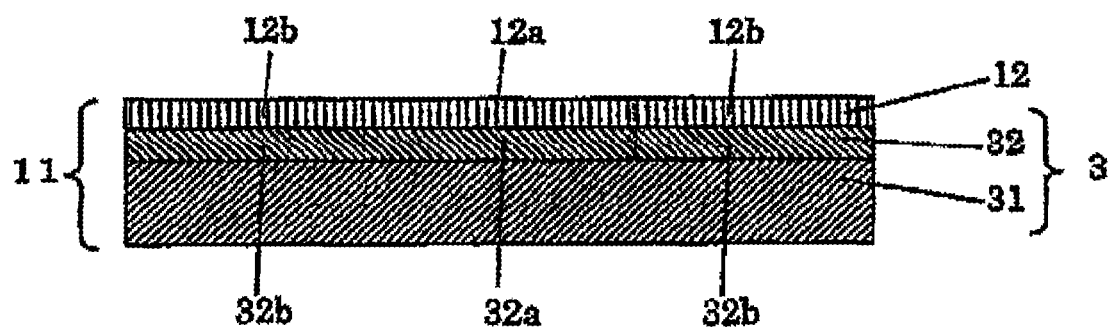
FIG. 2 is a cross-sectional schematic view showing another embodiment of a dicing tape-integrated film for semiconductor back surface of the invention.

Embodiments of the present invention are described with reference to FIGS. 1 and 2 but the invention is not restricted to these embodiments. FIG. 1 is a cross-sectional schematic view showing one embodiment of a dicing tape-integrated film for semiconductor back surface according to the present embodiment. FIG. 2 is a cross-sectional schematic view showing another embodiment of a dicing tape-integrated film for semiconductor back surface according to the present embodiment. Incidentally, in the figures in the present specification, parts that are unnecessary for the description are not given, and there are parts shown by magnifying, minifying, etc. in order to make the description easy.
(Dicing Tape-Integrated Film for Semiconductor Back Surface)

As shown in FIG. 1, the dicing tape-integrated film for semiconductor back surface 1 (hereinafter sometimes also referred to as "dicing tape-integrated semiconductor back surface protective film", "film for semiconductor back surface with dicing tape", or "semiconductor back surface protective film with dicing tape") has a configuration including: the dicing tape 3 including the pressure-sensitive adhesive layer 32 formed on the base material 31 and the film for flip chip type semiconductor back surface 2 (hereinafter sometimes referred to as "film for semiconductor back surface" or "semiconductor back surface protective film") formed on the pressure-sensitive adhesive layer 32. The film for semiconductor back surface 2 is formed only on the part 32a corresponding to the semiconductor wafer-attaching part. Moreover, the invention may be the dicing tape-integrated film for semiconductor back surface 11 having a configuration including the film for semiconductor back surface 12 provided over the whole surface of the pressure-sensitive adhesive layer 32. Incidentally, the surface of the film for semiconductor back surface 2 (surface to be attached to the back surface of the wafer) may be protected with a separator or the like until the film is attached to the wafer back surface.
(Film for Flip Chip Type Semiconductor Back Surface)

The film for semiconductor back surface 2 (or 12) has a film shape. The film for semiconductor back surface 2 (or 12) is usually in an uncured state (including a semi-cured state) in the embodiment of the dicing tape-integrated film for semiconductor back surface as a product and is thermally cured after the dicing tape-integrated film for semiconductor back surface is attached to the semiconductor wafer (details will be described later).

The film for semiconductor back surface 2 (or 12) can be formed of a resin composition and is preferably formed of a resin composition containing a thermosetting resin component and a thermoplastic resin component. Moreover, the film for semiconductor back surface 2 (or 12) may be constituted by a thermoplastic resin composition using no thermosetting resin component or may be constituted by a thermosetting resin composition using no thermoplastic resin component.

Examples of the thermoplastic resin component include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET (polyethylene terephthalate) or PBT (polybutylene terephthalate), a polyamideimide resin, or a fluorine resin. The thermoplastic resin may be employed singly or in a combination of two or more kinds. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl(meth) acrylate, 2-hydroxypropyl(meth)acrylate, 4-hydroxybutyl (meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth) acrylamidopropanesulfonic acid, sulfopropyl(meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid, (meth) acrylate means acrylate and/or methacrylate, (meth)acryl means acryl and/or methacryl, etc., which shall be applied over the whole specification.

Moreover, examples of the thermosetting resin component include, in addition to an epoxy resin and a phenol resin, an amino resin, an unsaturated polyester resin, a polyurethane resin, a silicone resin and a thermosetting polyimide resin. The thermosetting resin component may be employed singly or in a combination of two or more kinds. As the thermosetting resin component, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is, when the mixing ratio becomes outside the range, a curing reaction does not proceed sufficiently, and the characteristics of the epoxy resin cured product tends to deteriorate.

In the invention, a thermal curing-accelerating catalyst for the epoxy resins and the phenol resins may be used. The thermal curing-accelerating catalyst is not particularly restricted and can be suitably selected from known thermal curing-accelerating catalysts and used. The thermal curing-accelerating catalyst may be employed singly or in a combination of two or more kinds. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

The film for semiconductor back surface is particularly suitably formed of a resin composition containing an epoxy resin and a phenol resin or a resin composition containing an epoxy resin, a phenol resin, and an acrylic resin. Since these resins contain only a small amount of ionic impurities and have high heat resistance, reliability of the semiconductor element can be secured. The mixing ratio in this case is not particularly restricted but, for example, in the case where the acrylic resin is contained, the mixing amount of the epoxy resin and the phenol resin can be appropriately selected from the range of 10 to 200 parts by weight based on 100 parts by weight of the acrylic resin component.

It is important that the film for semiconductor back surface 2 (or 12) has adhesiveness (close adhesiveness) to the back surface (non-circuit-formed face) of the semiconductor wafer. The film for semiconductor back surface 2 (or 12) can be, for example, formed of a resin composition containing an epoxy resin as a thermosetting resin component. In the case where the film for semiconductor back surface 2 (or 12) is cured beforehand to some degree, at its preparation, a polyfunctional compound capable of reacting with a functional group or the like at a molecular chain end of the polymer can be added as a crosslinking agent. Thereby, an adhesive characteristics under high temperature can be enhanced and an improvement of the heat resistance can be achieved.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component.

In the invention, instead of the use of the crosslinking agent or together with the use of the crosslinking agent, it is also possible to perform a crosslinking treatment by irradiation with an electron beam, UV light, or the like.

The film for semiconductor back surface 2 (or 12) is preferably colored. Thereby, an excellent laser marking property and an excellent appearance property can be exhibited, and it becomes possible to make a semiconductor device having a value-added appearance property. As above, since the colored film for semiconductor back surface 2 (or 12) has an excellent marking property, marking can be performed to impart various kinds of information such as literal information and graphical information to the face on the non-circuit side of the semiconductor element or a semiconductor device using the semiconductor element by utilizing any of various marking methods such as a printing method and a laser marking method through the film of semiconductor back surface 2 (or 12). Particularly, by controlling the color of coloring, it becomes possible to observe the information (for example, literal information and graphical information) imparted by marking with excellent visibility. Moreover, when the film for semiconductor back surface is colored, the dicing tape and the film for semiconductor back surface can be easily distinguished from each other, so that workability and the like can be enhanced. Furthermore, for example, as a semiconductor device, it is possible to classify products thereof by using different colors. In the case where the film for semiconductor back surface 2 (or 12) is colored (the case where the film is neither colorless nor transparent), the color shown by coloring is not particularly limited but, for example, is preferably dark color such as black, blue or red color, and black color is especially suitable.

In the present embodiment, dark color basically means a dark color having $L^*$, defined in $L^*a^*b^*$ color space, of 60 or smaller (0 to 60), preferably 50 or smaller (0 to 50), and more preferably 40 or smaller (0 to 40).

Moreover, black color basically means a black-based color having $L^*$, defined in $L^*a^*b^*$ color space, of 35 or smaller (0 to 35), preferably 30 or smaller (0 to 30), and more preferably 25 or smaller (0 to 25). In this regard, in the black color, each of $a^*$ and $b^*$, defined in the $L^*a^*b^*$ color space, can be suitably selected according to the value of $L^*$. For example, both of $a^*$ and $b^*$ are within the range of preferably $-10$ to 10, more preferably $-5$ to 5, and further preferably $-3$ to 3 (particularly 0 or about 0).

In the present embodiment, $L^*$, $a^*$, and $b^*$ defined in the $L^*a^*b^*$ color space can be determined by a measurement with a color difference meter (a trade name "CR-200" manufactured by Minolta Ltd; color difference meter). The $L^*a^*b^*$ color space is a color space recommended by the Commission Internationale de l'Eclairage (CIE) in 1976, and means a color space called CIE1976($L^*a^*b^*$) color space. Also, the $L^*a^*b^*$ color space is defined in Japanese Industrial Standards in JIS Z8729.

At coloring of the film for semiconductor back surface 2 (or 12), according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the film for semiconductor back surface 2 (or 12), so that the film for semiconductor back surface (as a result, the dicing tape-integrated film for semiconductor back surface) having a homogeneous or almost homogeneous color density can be easily produced. Accordingly, when a dye is used as a colorant, the film for semiconductor back surface 2 (or 12) in the dicing tape-integrated film for semiconductor back surface 1 can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the film for semiconductor back surface 2 (or 12) is colored, the colored form is not particularly restricted. The film for semiconductor back surface may be, for example, a single-layer film-shaped article added with a coloring agent. Moreover, the film may be a laminated film where a resin layer formed of at least a thermosetting resin component and a coloring agent layer are at least laminated. In this regard, in the case where the film for semiconductor back surface 2 (or 12) is a laminated film of the resin layer and the coloring agent layer, the film for semiconductor back surface 2 (or 12) in the laminated form preferably has a laminated form of a resin layer/a coloring agent layer/a resin layer. In this case, two resin layers at both sides of the coloring agent layer may be resin layers having the same composition or may be resin layers having different composition.

Into the film for semiconductor back surface 2 (or 12), other additives can be suitably blended according to the necessity. Examples of the other additives include an extender, an antiaging agent, an antioxidant, and a surfactant, in addition to a filler, a flame retardant, a silane-coupling agent, and an ion-trapping agent.

The filler may be any of an inorganic filler and an organic filler but an inorganic filler is suitable. By blending a filler such as an inorganic filler, imparting of electric conductivity to the film for semiconductor back surface, improvement of the thermal conductivity, control of elastic modulus, and the like can be achieved. In this regard, the film for semiconductor back surface 2 (or 12) may be electrically conductive or non-conductive. Examples of the inorganic filler include various inorganic powders composed of silica, clay, gypsum, calcium carbonate, barium sulfate, alumina oxide, beryllium oxide, ceramics such as silicone carbide and silicone nitride, metals or alloys such as aluminum, copper, silver, gold, nickel, chromium, lead, tin, zinc, palladium, and solder, carbon, and the like. The filler may be employed singly or in a combination of two or more kinds. Particularly, the filler is suitably silica and more suitably fused silica. The average particle diameter of the inorganic filler is preferably within the range of 0.1 μm to 80 μm. The average particle diameter of the inorganic filler can be measured by a laser diffraction-type particle size distribution measurement apparatus.

The blending amount of the filler (in particular, inorganic filler) is preferably 80 parts by weight or less (0 part by weight to 80 parts by weight) and more preferably 0 part by weight to 70 parts by weight based on 100 parts by weight of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film for semiconductor back surface 2 (or 12) can be, for example, formed by utilizing a commonly used method including mixing a thermosetting resin such as an epoxy resin and, if necessary, a thermoplastic resin such as an acrylic resin and optional solvent and other additives to prepare a resin composition, followed by forming it to a film-shaped layer. Specifically, a film-shaped layer (adhesive layer) as the film for semiconductor back surface can be formed, for example, by a method including applying the resin composition on the pressure-sensitive adhesive layer 32 of the dicing tape; a method including applying the resin composition on an appropriate separator (such as release paper) to form a resin layer (or an adhesive layer) and then transferring (transcribing) it on the pressure-sensitive adhesive layer 32; or the like. In this regard, the resin composition may be a solution or a dispersion.

Incidentally, in the case where the film for semiconductor back surface 2 (or 12) is formed of a resin composition containing a thermosetting resin component such as an epoxy resin, the film for semiconductor back surface 2 (or 12) is in a state that the thermosetting resin component is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin component in the film for semiconductor back surface 2 (or 12) is completely or almost completely cured.

As above, since the film for semiconductor back surface 2 (or 12) is in a state that the thermosetting resin component is uncured or partially cured even when the film contains the thermosetting resin component, the gel fraction of the film for semiconductor back surface is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the film for semiconductor back surface 2 (or 12) can be measured by the following measuring method.

<Gel Fraction Measuring Method>

About 0.1 g of a sample is sampled from the film for semiconductor back surface 2 (or 12) and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

$$\text{Gel fraction (\% by weight)} = [(\text{Weight after immersion and Drying})/(\text{Weight of sample})] \times 100 \quad (a)$$

The gel fraction of the film for semiconductor back surface 2 (or 12) can be controlled by the kind and content of the resin components and the kind and content of the crosslinking agent and besides, heating temperature, heating time and the like.

In the invention, in the case where the film for semiconductor back surface 2 (or 12) is a film-shaped article formed of a resin composition containing a thermosetting resin such as an epoxy resin, close adhesiveness to a semiconductor wafer can be effectively exhibited.

Incidentally, since cutting water is used in the dicing step of the semiconductor wafer, the film for semiconductor back surface 2 (or 12) absorbs moisture to have a moisture content of a normal state or more in some cases. When flip chip bonding is performed with still maintaining such a high moisture content, water vapor remains at the adhesion interface between the film for semiconductor back surface 2 (or 12) and the semiconductor wafer or its processed body (semiconductor) and lifting is generated in some cases. Therefore, by constituting the film for semiconductor back surface 2 (or 12) as a configuration in which a core material having a high moisture permeability is provided on each surface thereof, water vapor diffuses and thus it becomes possible to avoid such a problem. From such a viewpoint, a multilayered structure in which the film for semiconductor back surface 2 (or 12) is formed at one surface or both surfaces of the core material may be used as the film for semiconductor back surface. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of the laminated film) of the film for semiconductor back surface 2 (or 12) is not particularly restricted but can be, for example, suitably selected from the range of about 2 μm to 200 μm. Furthermore, the thickness is preferably about 4 μm to 160 μm, more preferably about 6 μm to 100 μm, and particularly about 10 μm to 80 μm.

The tensile storage elastic modulus of the film for semiconductor back surface 2 (or 12) in an uncured state at 23° C. is preferably 1 GPa or more (e.g., 1 GPa to 50 GPa), more preferably 2 GPa or more, and particularly, 3 GPa or more is suitable. When the tensile storage elastic modulus is 1 GPa or more, the attachment of the film for semiconductor back surface to a support can be effectively suppressed or prevented at the time when the film for semiconductor back surface 2 (or 12) is placed on the support and transportation and the like are performed after the semiconductor chip is peeled from the pressure-sensitive adhesive layer 32 of the dicing tape together with the film for semiconductor back surface 2 (or 12). In this regard, the support is, for example, a top tape, a bottom tape, and the like in a carrier tape. In the case where the film for semiconductor back surface 2 (or 12) is formed of a resin composition containing a thermosetting resin component, as mentioned above, the thermosetting resin component is usually in a uncured or partially cured state, so that the tensile storage elastic modulus of the film for semiconductor back surface at 23° C. is a tensile storage elastic modulus at 23° C. in a state that the thermosetting resin component is uncured or partially cured.

Here, the film for semiconductor back surface 2 (or 12) may be either a single layer or a laminated film where a plurality of layers are laminated. In the case of the laminated film, the tensile storage elastic modulus is sufficiently 1 GPa or more (e.g., 1 GPa to 50 GPa) as the whole laminated film. Also the tensile storage elastic modulus (23° C.) of the film for semiconductor back surface in an uncured state can be controlled by suitably setting up the kind and content of the resin components (thermoplastic resin and/or thermosetting resin) or the kind and content of a filler such as a silica filler. In the case where the film for semiconductor back surface 2 (or 12) is a laminated film where a plurality of layers are laminated (in the case where the film for semiconductor back surface has a form of the laminated layer), as the laminated layer form, for example, a laminated form composed of a wafer adhesive layer and a laser marking layer can be exemplified. Moreover, between the wafer adhesive layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesive layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking on the back surface of a semiconductor chip.

The tensile storage elastic modulus is determined by preparing the film for semiconductor back surface 2 (or 12) in an uncured state without lamination onto the dicing tape 3 and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the measured elastic modulus is regarded as a value of tensile storage elastic modulus obtained.

In the dicing tape-integrated film for semiconductor back surface 1 shown in FIG. 1, it is preferred to design the film so that the pressure-sensitive adhesive force of the film for semiconductor back surface 2 toward the semiconductor wafer is larger than the pressure-sensitive adhesive force (to be mentioned later) toward the foregoing part 32a of the pressure-sensitive adhesive layer 32. The pressure-sensitive adhesive force toward the semiconductor wafer is suitably set up depending on the kind but, in view of the reliability at dicing, picking-up, and die bonding as well as picking-up property, the pressure-sensitive adhesive force is preferably within the range of 0.5 N/20 mm to 15 N/20 mm, more preferably within the range of 0.7 N/20 mm to 10 N/20 mm. Moreover, the pressure-sensitive adhesive force of the film for semiconductor back surface 2 toward the foregoing part 32a is preferably within the range of 0.02 N/20 mm to 10 N/20 mm, more preferably within the range of 0.05 N/20 mm to 5 N/20 mm. Incidentally, the pressure-sensitive adhesive force is a value measured under conditions of an ordinary temperature (23° C.), a peeling angle of 180°, and a peeling rate of 300 mm/min.

In the dicing tape-integrated film for semiconductor back surface 11 shown in FIG. 2, it is preferred to design the film so that the pressure-sensitive adhesive force of the semiconductor wafer-attaching part 12a toward the semiconductor wafer is larger than the pressure-sensitive adhesive force (to be mentioned later) toward the part 32a of the pressure-sensitive adhesive layer 32. The pressure-sensitive adhesive force toward the semiconductor wafer is suitably set up depending on the kind but, in view of the reliability at dicing, picking-up, and die bonding as well as the picking-up property, as described above, the pressure-sensitive adhesive force is preferably within the range of 0.5 N/20 mm to 15 N/20 mm, more preferably within the range of 0.7 N/20 mm to 10 N/20 mm. Moreover, the pressure-sensitive adhesive force of the semiconductor wafer-attaching part 12a toward the foregoing part 32a is preferably within the range of 0.02 N/20 mm to 10 N/20 mm, more preferably within the range of 0.05 N/20 mm to 5 N/20 mm. Furthermore, the pressure-sensitive adhesive force of the part 12b other than the semiconductor wafer-attaching part 12a toward the part 32b other than the foregoing part 32a is preferably within the range of 0.50 N/20 mm to 20 N/20 mm, more preferably within the range of 0.70 N/20 mm to 15 N/20 mm. Incidentally, the foregoing pressure-sensitive adhesive force is a value measured under conditions of an ordinary temperature (23° C.), a peeling angle of 180°, and a peeling rate of 300 mm/min.

The film for semiconductor back surface 2 (or 12) is preferably protected with a separator (release liner, not shown in figures). The separator has a function as a protective material for protecting the wafer back surface protective film until it is practically used. Moreover, the separator can be further used as a supporting base material at the time when the film for semiconductor back surface 2 (or 12) is transferred to the pressure-sensitive adhesive layer 32 on the base material of the dicing tape. The separator is peeled off when a semiconductor wafer is attached onto the film for semiconductor back surface of the dicing tape-integrated film for semiconductor back surface 1. As the separator, a film of polyethylene or polypropylene, as well as a plastic film (such as polyethylene terephthalate), a paper or the like whose surface is coated with a releasing agent such as a fluorine-based releasing agent or a long-chain alkyl acrylate-based releasing agent can also be used. The separator can be formed by a conventionally known method. Moreover, the thickness or the like of the separator is not particularly restricted.

The film for semiconductor back surface 2 (or 12) is preferably protected with a separator having a release layer on at least one surface.

Moreover, the light transmittance with a visible light (visible light transmittance, wavelength: 400 to 800 nm) in the film for semiconductor back surface 2 (or 12) is not particularly restricted but is, for example, preferably in the range of 20% or less (0 to 20%), more preferably 10% or less (0 to 10%), and particularly preferably 5% or less (0 to 5%). When the film for semiconductor back surface 2 (or 12) has a visible light transmittance of more than 20%, there is a concern that the transmission of the light may adversely influence the semiconductor element. The visible light transmittance (%) can be controlled by the kind and content of the resin components of the film for semiconductor back surface 2 (or 12), the kind and content of the coloring agent (such as pigment or dye), the content of the inorganic filer, and the like.

The visible light transmittance (%) of the film for semiconductor back surface 2 (or 12) can be determined as follows. Namely, a film for semiconductor back surface 2 (or 12) having a thickness (average thickness) of 20 μm itself is prepared. Then, the film for semiconductor back surface 2 (or 12) is irradiated with a visible light having a wavelength of 400 to 800 nm in a prescribed intensity [apparatus: a visible light generating apparatus manufactured by Shimadzu Corporation [trade name "ABSORPTION SPECTRO PHOTOMETER"], and the intensity of transmitted visible light is measured. Further, the visible light transmittance (%) can be determined based on intensity change before and after the transmittance of the visible light through the film for semiconductor back surface 2 (or 12). In this regard, it is also possible to derive visible light transmittance (%; wavelength: 400 to 800 nm) of the film for semiconductor back surface 2 (or 12) having a thickness of 20 μm from the value of the visible light transmittance (%; wavelength: 400 to 800 nm) of the film for semiconductor back surface 2 (or 12) whose thickness is not 20 μm. In the invention, the visible light transmittance (%) is determined in the case of the film for semiconductor back surface 2 (or 12) having a thickness of 20 μm, but the film for semiconductor back surface according to the invention is not limited to one having a thickness of 20 μm.

Moreover, as the film for semiconductor back surface 2 (or 12), one having lower moisture absorbance is more preferred. Specifically, the moisture absorbance is preferably 1% by weight or less and more preferably 0.8% by weight or less. By regulating the moisture absorbance to 1% by weight or less, the laser marking property can be enhanced. Moreover, for example, the generation of voids between the film for semiconductor back surface 2 (or 12) and the semiconductor element can be suppressed or prevented in the reflow step. The moisture absorbance is a value calculated from a weight change before and after the film for semiconductor back surface 2 (or 12) is allowed to stand under an atmosphere of a temperature of 85° C. and a humidity of 85% RH for 168 hours. In the case where the film for semiconductor back surface 2 (or 12) is formed of a resin composition containing a thermosetting resin, the moisture absorbance means a value obtained when the film after thermal curing is allowed to stand under an atmosphere of a temperature of 85° C. and a humidity of 85% RH for 168 hours. Moreover, the moisture absorbance can be regulated, for example, by changing the amount of the inorganic filler to be added.

Moreover, as the film for semiconductor back surface 2 (or 12), one having a smaller ratio of volatile matter is more preferred. Specifically, the ratio of weight decrease (weight decrease ratio) of the film for semiconductor back surface 2 (or 12) after heating treatment is preferably 1% by weight or less and more preferably 0.8% by weight or less. The conditions for the heating treatment are a heating temperature of 250° C. and a heating time of 1 hour. By regulating the weight decrease ratio to 1% by weight or less, the laser marking property can be enhanced. Moreover, for example, the generation of cracks in a flip chip type semiconductor device can be suppressed or prevented in the reflow step. The weight decrease ratio can be regulated, for example, by adding an inorganic substance capable of reducing the crack generation at lead-free solder reflow. In the case where the film for semiconductor back surface 2 (or 12) is formed of a resin composition containing a thermosetting resin component, the weight decrease ratio is a value obtained when the film for semiconductor back surface after thermal curing is heated under conditions of a temperature of 250° C. and a heating time of 1 hour.

(Dicing Tape)

The dicing tape 3 includes a base material 31 and a pressure-sensitive adhesive layer 32 formed on the base material 31. Thus, the dicing tape 3 sufficiently has a configuration in which the base material 31 and the pressure-sensitive adhesive layer 32 are laminated. The base material (supporting base material) can be used as a supporting material for the pressure-sensitive adhesive layer and the like. The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the film for semiconductor back surface 2 (or 12) is reduced by thermal contraction of the base material 31 after dicing and thus the recovery of the semiconductor chip can be facilitated.

A commonly used surface treatment, e.g., a chemical or physical treatment such as a chromate treatment, ozone exposure, flame exposure, exposure to high-voltage electric shock, or an ionized radiation treatment, or a coating treatment with an undercoating agent e.g., a pressure-sensitive adhesive substance to be mentioned later) may be applied onto the surface of the base material 31 in order to enhance close adhesiveness with the adjacent layer, holding properties, and the like.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 µm or less (e.g., 1 µm to 1,000 µm), preferably 10 µm to 500 µm, further preferably 20 µm to 300 µm, and particularly preferably about 30 µm to 200 µm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

The pressure-sensitive adhesive layer 32 is formed of at least a radiation-curable pressure-sensitive adhesive, and decrease in the pressure-sensitive adhesive force toward the film for semiconductor back surface 2 (or 12) can be achieved by irradiation with a radiation ray. The part to be cured at picking-up is not necessarily the whole region of the pressure-sensitive adhesive layer 32. It is sufficient that at least the part 32*a* corresponding to the film for semiconductor back surface 2 or the semiconductor wafer-attaching part 12*a* in the film for semiconductor back surface 12 is cured (see FIGS. 1 and 2). In the case of the dicing tape-integrated film for semiconductor back surface 1 shown in FIG. 1, a dicing ring 35 can be fixed to the part 32*b* in the pressure-sensitive adhesive layer 32. As the dicing ring 35, one composed of a metal such as stainless steel or one made of a resin can be used.

In the dicing tape-integrated film for semiconductor back surface 1 (or 11), in view of the fixing and holding force of a wafer, the pressure-sensitive adhesive force of the pressure-sensitive adhesive layer 32 toward the film for semiconductor back surface 2 (or 12) is preferably within the range of 0.02 N/20 mm to 10 N/20 mm, more preferably within the range of 0.05 N/20 mm to 5 N/20 mm. When the pressure-sensitive adhesive force is less than 0.02 N/20 mm, the adhesion and fixing of a semiconductor element is insufficient, so that there is a case where chip fly and chipping occur at dicing. Also, since the close adhesiveness between the pressure-sensitive adhesive layer 32 and the film for semiconductor back surface 2 (or 12) decreases, the cutting water used at dicing penetrates between the both in some cases. On the other hand, when the pressure-sensitive adhesive force exceeds 10 N/20 mm, there is a case where adhesive residue onto the dicing ring occurs. Incidentally, the pressure-sensitive adhesive force is a value measured under conditions of an ordinary temperature (23° C.), a peeling angle of 180°, and a peeling rate of 300 mm/min.

Here, when the diameter of the semiconductor wafer is taken as r1, the diameter of the foregoing part 32*a* in the pressure-sensitive adhesive layer 32 is taken as r2, and the diameter of the film for semiconductor back surface 2 or the semiconductor wafer-attaching part 12*a* in the film for semiconductor back surface 12 is taken as r3, it is preferred to satisfy a relation: r1<r2<r3. Thereby, the whole surface of the semiconductor wafer can be adhered and fixed onto the film for semiconductor back surface 2 (or 12).

As the radiation-curable pressure-sensitive adhesive, an internal UV curable pressure-sensitive adhesive (internal-type UV curable pressure-sensitive adhesive) in which a polymer having a radically reactive carbon-carbon double bond in an acrylic polymer side chain or main chain is used as the base polymer, an addition-type radiation-curable pressure-sensitive adhesive in which a UV curable monomer component or oligomer component is blended into an acrylic pressure-sensitive adhesive, and the like can be used. Since the internal UV curable pressure-sensitive adhesive should not contain the oligomer component or the like that is a low-molecular-weight component or does not contain the component in most cases, a pressure-sensitive adhesive layer having a stable layer structure can be formed without migration of the oligomer component or the like with the lapse of time, so that the internal UV curable pressure-sensitive adhesive can be suitably used as the radiation-curable pressure-sensitive adhesive. In this regard, the UV curable pressure-sensitive adhesive may be a UV curable pressure-sensitive adhesive in which the internal UV curable pressure-sensitive adhesive and the addition-type UV curable pressure-sensitive adhesive are mixed. Specifically, there can be used a UV curable pressure-sensitive adhesive in which a UV curable monomer component or an oligomer component is blended into the internal UV curable pressure-sensitive adhesive containing a base polymer (particularly, an acrylic polymer) having a radically reactive carbon-carbon double bond to such a degree that characteristic properties are not deteriorated.

In the invention, as the acrylic polymer, there may be mentioned those in which an acrylic acid ester is used as a main monomer component. Examples of the acrylic acid ester include acrylic acid alkyl esters (e.g., esters of a straight chain or branched chain alkyl group having 1 to 30 carbon atoms, particularly 4 to 18 carbon atoms, such as a methyl ester, an ethyl ester, a propyl ester, an isopropyl ester, a butyl ester, an isobutyl ester, a sec-butyl ester, a t-butyl ester, a pentyl ester, an isopentyl ester, a hexyl ester, a heptyl ester, an octyl ester, a 2-ethylhexyl ester, an isooctyl ester, a nonyl ester, a decyl ester, an isodecyl ester, an undecyl ester, a dodecyl ester, a tridecyl ester, a tetradecyl ester, a hexadecyl ester, an octadecyl ester, an eicosyl ester, etc.) and acrylic acid cycloalkyl esters (e.g., a cyclopentyl ester, a cyclohexyl ester, etc.). These monomers may be employed singly or in a combination of two or more kinds.

Among such acrylic acid esters exemplified in the above, in the invention, monomers represented by the chemical formula $CH_2$=CHCOOR (where R is an alkyl group having 6 to 10 carbon atoms, more preferably 8 to 9 carbon atoms) are preferably used. When the number of the carbon atoms is 6 or more, it is suppressed to have too large peeling force and the picking-up property is prevented from lowering. On the other hand, when the number of the carbon atoms is 10 or less, the decrease in the adhesiveness with the film for semiconductor back surface 2 (or 12) is suppressed and, as a result, the occurrence of chip fly can be prevented at dicing. Moreover, in the case where the acrylic acid ester is represented by the chemical formula $CH_2$=CHCOOR, the blending ratio is preferably 50 to 91 mol %, more preferably 80 to 87 mol % based on 100 mol % of the acrylic acid ester in the acrylic polymer. When the blending ratio is less than 50 mol %, the peeling force becomes too large and the picking-up property may lower in some cases. On the other hand, when the ratio exceeds 90 mol %, the pressure-sensitive adhesiveness lowers and there is a case that chip fly occurs at dicing. Furthermore, among the monomers represented by the foregoing chemical formula, 2-ethylhexyl acrylate, isooctyl acrylate, and isononyl acrylate are particularly preferred.

The acrylic polymer may be one in which a hydroxyl group-containing monomer copolymerizable with the acrylic acid ester is used as a monomer component. Examples of the hydroxyl group-containing monomer include 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)methyl(meth)acrylate. As the hydroxyl group-containing monomer, hydroxyalkyl (meth)acrylates whose alkyl group in the hydroxyalkyl group has 2 to 4 carbon atoms (e.g., 2-hydroxyethyl(meth) acrylate, 2-hydroxypropyl(meth)acrylate, 4-hydroxybutyl (meth)acrylate, etc.) are suitable. Among them, hydroxyalkyl acrylates whose alkyl group in the hydroxyalkyl group has 2 to 4 carbon atoms (e.g., 2-hydroxyethyl acrylate, 2-hydroxypropyl acrylate, 4-hydroxybutyl acrylate, etc.) can be suitably used. The hydroxyl group-containing monomer can be employed singly or in combination of two or more kinds.

The blending ratio of the hydroxyl group-containing monomer is preferably within the range of 10 to 40 mol %, preferably within the range of 15 to 30 mol % based on 100 mol % of the acrylic acid ester. When the blending ratio is less than 10 mol %, the crosslinking after UV irradiation is insufficient and the picking-up property may lower in some cases. On the other hand, when the blending ratio exceeds 40 mol %, the polarity of the pressure-sensitive adhesive increases and the interaction with the film for semiconductor back surface 2 (or 12) becomes high, so that peeling becomes difficult.

For the purpose of modifying cohesive force, heat resistance, and the like, the acrylic polymer may contain a unit corresponding to other monomer component copolymerizable with the acrylic acid alkyl ester. Examples of such a monomer component include methacrylic acid alkyl esters such as methyl methacrylate, ethyl methacrylate, propyl methacrylate, isopropyl methacrylate, butyl methacrylate, isobutyl methacrylate, t-butyl methacrylate, s-butyl methacrylate, and pentyl methacrylate; carboxyl group-containing monomers such as acrylic acid, methacrylic acid, carboxylethyl(meth)acrylate, carboxylpentyl(meth)acrylate, itaconic acid, maleic acid, fumaric acid, and crotonic acid; acid anhydride monomers such as maleic anhydride and itaconic anhydride; sulfonic acid group-containing monomers such as styrenesulfonic acid, allylsulfonic acid, 2-(meth)acrylamido-2-methylpropanesulfonic acid, (meth) acrylamidopropanesulfonic acid, sulfopropyl(meth)acrylate, and (meth)acryloyloxynaphthalenesulfonic acid; phosphoric acid group-containing monomers such as 2-hydroxyethylacryloyl phosphate; and methacrylamide, acrylonitrile, and methacrylic acid cycloalkyl ester. These copolymerizable monomer components can be employed singly or in a combination of two or more kinds. The amount of the copolymerizable monomer to be used is preferably 40% by weight or less based on the total monomer components. However, in the case of the carboxyl group-containing monomer, the boundary face between the pressure-sensitive adhesive layer 32 and the film for semiconductor back surface 2 (or 12) disappears by the reaction of the carboxyl group with the epoxy group in the epoxy resin in the film for semiconductor back surface 2 (or 12), so that the peeling property between the both may lower. Therefore, the amount of the carboxyl group-containing monomer to be used is preferably 0 to 3% by weight based on the total monomer components. Moreover, among these monomer components, the acrylic polymer constituting the pressure-sensitive adhesive layer 32 of the invention preferably contains no acrylic acid as the monomer component. This is because acrylic acid diffuses into the film for semiconductor back surface 2 (or 12) and may result in disappearance of the boundary face between the pressure-sensitive adhesive layer 32 and the film for semiconductor back surface 2 (or 12) to lower the peeling property in some cases.

Here, the acrylic polymer preferably contains no polyfunctional monomer as the monomer for copolymerization. Thereby, there is no possibility of diffusion of the polyfunctional monomer into the film for semiconductor back surface 2 (or 12) and thus the lowering of the picking-up property owing to the disappearance of the boundary face between the pressure-sensitive adhesive layer 32 and the film for semiconductor back surface 2 (or 12) can be prevented.

In addition, an acrylic polymer in which a radically reactive carbon-carbon double bond is introduced into the side chain or main chain or into the main chain end of the acrylic polymer (particularly, a hydroxyl group-containing acrylic polymer) can be obtained by using an isocyanate compound having a radically reactive carbon-carbon double bond in the molecule. Examples of the isocyanate compound include methacryloyl isocyanate, 2-methacryloyloxyethyl isocyanate, 2-acryloyloxyethyl isocyanate, and m-isopropenyl-α,α-dimethylbenzyl isocyanate.

The blending ratio of the isocyanate compound having a radically reactive carbon-carbon double bond in the molecule is preferably within the range of 70 to 90 mol %, more preferably within the range of 75 to 85 mol % based on 100 mol % of the hydroxyl group-containing monomer. When the blending ratio is less than 70 mol %, the crosslinking after UV irradiation is insufficient and the picking-up property may lower in some cases. On the other hand, when the blending ratio exceeds 90 mol %, the polarity of the pressure-sensitive adhesive increases and the interaction with the film for semiconductor back surface 2 (or 12) becomes high, so that picking-up property lowers.

The acrylic polymer is obtained by subjecting the aforementioned monomer mixture to polymerization. The polymerization can be also carried out by any method of solution polymerization, emulsion polymerization, bulk polymerization, suspension polymerization, and the like. In view of prevention of staining of a clean adherend, a smaller content of low-molecular-weight substances is more preferred. From such a viewpoint, the weight-average molecular weight of the acrylic polymer is preferably 350,000 to 1,000,000 and further preferably about 450,000 to 800,000. The weight-average molecular weight is measured by GPC (gel permeation chromatography) and is a value calculated in terms of polystyrene.

In the invention, a compound having two or more radically reactive carbon-carbon double bonds in the molecule may be blended into the internal UV curable pressure-sensitive adhesive. The compound having two or more radically reactive carbon-carbon double bonds in the molecule is used for adjusting a degree of crosslinking, adjusting tensile elastic modulus, and the like. As the compound having two or more radically reactive carbon-carbon double bonds in the molecule, there may be mentioned UV curable monomer components and oligomer components to be used in the addition type radiation-curable pressure-sensitive adhesives. Specifically, examples of components of such compound having two or more radically reactive carbon-carbon double bonds in the molecule include monomers such as urethane oligomers, urethane (meth)acrylates, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth) acrylate, and 1,4-butanediol di(meth)acrylate. Moreover, the foregoing isocyanate compounds may be also mentioned. Furthermore, various UV curable oligomers such as urethane-based, polyether-based, polyester-based, polycarbonate-based, and polybutadiene-based oligomers may be mentioned, and those having a molecular weight in the range of about 100 to 30,000 are suitable. Moreover, the blending ratio of the compound having two or more radically reactive carbon-carbon double bonds in the molecule is 500 parts by weight or less (e.g., 5 parts by weight to 500 parts by weight), preferably about 40 parts by weight to 150 parts by weight based on 100 parts by weight of the acrylic polymer constituting the pressure-sensitive adhesive. When the blending ratio is less than 5 parts by weight, the degree of crosslinking after irradiation with a radiation ray is low, so that the tensile elastic modulus decreases. As a result, at dicing of a semiconductor wafer, in the case where a dicing ring is attached onto the pressure-sensitive adhesive layer 32, paste residue occurs on the dicing ring. At the picking-up of semiconductor chips, the picking-up property may lower owing to too large peeling force in some cases. On the other hand, when the blending ratio exceeds 500 parts by weight, tensile elastic modulus increases. As a result, there is a case that chip fly occurs at dicing.

The method of introducing the radically reactive carbon-carbon double bond into the acrylic polymer is not particularly restricted and various methods can be adopted. However, it is easy to introduce the radically reactive carbon-carbon double bond into a polymer side chain in view of molecular design. For example, there may be mentioned a method in which a monomer having a hydroxyl group is copolymerized into the acrylic polymer beforehand and then an isocyanate compound having an isocyanate group reactive with the hydroxyl group and a radically reactive carbon-carbon double bond is subjected to a condensation or addition reaction with maintaining radiation curability of the radically reactive carbon-carbon double bond. As the isocyanate compound having an isocyanate group and a radically reactive carbon-carbon double bond, those exemplified in the above may be mentioned.

The radiation curable pressure-sensitive adhesive preferably contains a photopolymerization initiator. Examples of the photopolymerization initiator include α-ketol-based compounds such as 4-(2-hydroxyethoxy)phenyl (2-hydroxy-2-propyl) ketone, α-hydroxy-α,α'-dimethylacetophenone, 2-methyl-2-hydroxypropiophenone, and 1-hydroxycyclohexyl phenyl ketone; acetophenone-based compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether-based compounds such as benzoin ethyl ether, benzoin isopropyl ether, and anisoin methyl ether; ketal-based compounds such as benzyl dimethylketal; aromatic sulfonyl chloride-based compounds such as 2-naphthalenesulfonyl chloride; optically active oxime-based compounds such as 1-phenone-1,1-propanedione-2-(o-ethoxycarbonyl) oxime; benzophenone-based compounds such as benzophenone, benzoylbenzoic acid, and 3,3'-dimethyl-4-methoxybennzophenone; thioxanthone-based compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphor quinone; halogenated ketones; acylphosphinoxides; and acylphosphonates. The blending amount of the photopolymerization initiator is for example, about 0.05 to 20 parts by weight based on 100 parts by weight of the base polymer such as the acrylic polymer constituting the pressure-sensitive adhesive.

Incidentally, in the case where curing inhibition by oxygen occurs at irradiation with a radiation ray, it is desirable to shut off oxygen (air) from the surface of the radiation-curable pressure-sensitive adhesive layer 32. Examples of the method include a method including covering the surface of the pressure-sensitive adhesive layer 32 with a separator, a method including performing the irradiation with a radiation ray such as a UV ray in a nitrogen gas atmosphere, and the like.

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent can be used for adjusting the pressure-sensitive adhesive force before UV irradiation, adjusting the pressure-sensitive adhesive force after UV irradiation, and the like. By using the crosslinking agent, external crosslinking can be achieved. The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted but is appropriately determined depending on the balance with the base polymer (particularly acrylic polymer) to be crosslinked and further depending on the use application as a pressure-sensitive adhesive. In general, the crosslinking agent is preferably blended about 20 parts by weight or less, further 0.1 part by weight to 10 parts by weight based on 100 parts by weight of the base polymer.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, for example, there may be mentioned a method including applying a mixture containing a pressure-sensitive adhesive and optional solvent and other additives on the base material 31; a method including applying the foregoing mixture on an appropriate separator (such as a release paper) to form a pressure-sensitive adhesive layer and then transferring (transcribing) it on the base material 31; or the like.

The thickness of the pressure-sensitive adhesive layer 32 is not particularly restricted and, for example, is preferably about 5 μm to 300 μm, preferably 5 μm to 200 μm, further preferably 5 μm to 100 μm, and particularly preferably 7 μm to 50 μm. When the thickness of the pressure-sensitive adhesive layer 32 is within the above-mentioned range, an appropriate pressure-sensitive adhesive force can be exhibited. The pressure-sensitive adhesive layer may be either a single layer or a multi layer.

Incidentally, in the invention, the dicing tape-integrated film for semiconductor back surface 1 (or 11) can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the film for semiconductor back surface 2 (or 12), or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film for semiconductor back surface 2 (or 12) is preferably non-conductive from the viewpoint of having no electric leakage.

Moreover, the dicing tape-integrated film for semiconductor back surface 1 (or 11) may be formed in a form where it is wound as a roll or may be formed in a form where the sheet (film) is laminated. For example, in the case where the film has the form where it is wound as a roll, the film is wound as a roll in a state that the film for semiconductor back surface 2 (or 12) is protected by a separator according to needs, whereby the film can be prepared as a dicing tape-integrated film for semiconductor back surface 1 (or 11) in a state or form where it is wound as a roll. In this regard, the dicing tape-integrated film for semiconductor back surface 1 (or 11) in the state or form where it is wound as a roll may be constituted by the base material 31, the pressure-sensitive adhesive layer 32 formed on one surface of the base material 31, the film for semiconductor back surface 2 (or 12) formed on the pressure-sensitive adhesive layer 32, and a releasably treated layer (rear surface treated layer) formed on the other surface of the base material 31.

Incidentally, the thickness of the dicing tape-integrated film for semiconductor back surface 1 (total thickness of the thickness of the film for semiconductor back surface and the thickness of the dicing tape including the base material 31 and the pressure-sensitive adhesive layer 32) can be, for example, selected from the range of 8 μm to 1,500 μm, and it is preferably from 20 μm to 850 μm, more preferably 31 μm to 500 μm, and particularly preferably 47 μm to 330 μm.

In this regard, in the dicing tape-integrated film for semiconductor back surface 1 (or 11), by controlling the ratio of the thickness of the film for semiconductor back surface 2 (or 12) to the thickness of the pressure-sensitive adhesive layer 32 of the dicing tape 3 or the ratio of the thickness of the film for semiconductor back surface 2 (or 12) to the thickness of the dicing tape (total thickness of the base material 31 and the pressure-sensitive adhesive layer 32), a dicing property at the dicing step, a picking-up property at the picking-up step, and the like can be improved and the dicing tape-integrated film for semiconductor back surface 1 (or 11) can be effectively utilized from the dicing step of the semiconductor wafer to the flip chip bonding step of the semiconductor chip.

(Producing Method of Dicing Tape-Integrated Film for Semiconductor Back Surface)

The producing method of the dicing tape-integrated film for semiconductor back surface according to the present embodiment is described while using the dicing tape-integrated film for semiconductor back surface 1 shown in FIG. 1 as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the pressure-sensitive adhesive layer 32 is formed by applying a pressure-sensitive adhesive composition onto the base material 31, followed by drying (by crosslinking under heating, if necessary). Examples of the application method include roll coating, screen coating, and gravure coating. In this regard, the pressure-sensitive adhesive composition may be directly applied onto the base material 31 to form the pressure-sensitive adhesive layer 32 on the base material 31, or the pressure-sensitive adhesive composition may be applied onto a release paper or the like whose surface has been subjected to a releasable treatment to form a pressure-sensitive adhesive layer 32 and then the pressure-sensitive adhesive layer 32 may be transferred onto the base material 31. Consequently, a dicing tape 3 in which the pressure-sensitive adhesive layer 32 is formed on the base material 31 is prepared.

On the other hand, a coated layer is formed by applying a forming material for forming the film for semiconductor back surface 2 onto a release paper so as to have a prescribed thickness after drying and further drying under prescribed conditions (in the case where thermal curing is required or the like, performing a heating treatment to achieve drying, if necessary). By transferring the coated layer onto the pressure-sensitive adhesive layer 32, the film for semiconductor back surface 2 is formed on the pressure-sensitive adhesive layer 32. In this regard, the film for semiconductor back surface 2 can also be formed on the pressure-sensitive adhesive layer 32 by directly applying the forming material for forming the film for semiconductor back surface 2 onto the pressure-sensitive adhesive layer 32, followed by drying under prescribed conditions (in the case where thermal curing is required or the like, performing a heating treatment to achieve drying, if necessary). Consequently, the dicing tape-integrated film for semiconductor back surface 1 according to the invention can be obtained. Incidentally, in the case where thermal curing is performed at the formation of the film for semiconductor back surface 2, it is important to perform the thermal curing to such an extent that this is in a partially cured state. However, it is preferable that the thermal curing is not performed.

The dicing tape-integrated film for semiconductor back surface 1 (or 11) of the invention can be suitably used at the production of a semiconductor device including the flip chip connection step. Namely, the dicing tape-integrated film for semiconductor back surface 1 (or 11) of the invention is used at the production of a flip chip-mounted semiconductor device and thus the flip chip-mounted semiconductor device is produced in a condition or form where the film for semiconductor back surface 2 (or 12) of the dicing tape-integrated film for semiconductor back surface 1 (or 11) is attached to the back surface of the semiconductor chip. Therefore, the dicing tape-integrated film for semiconductor back surface 1 (or 11) of the invention can be used for a flip chip-mounted semiconductor device (a semiconductor device in a state or form where the semiconductor chip is fixed to an adherend such as a substrate by a flip chip bonding method).

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Production Process of Semiconductor Device)

The process for producing a semiconductor device according to the invention will be described referring to FIGS. 3A to 3E. FIGS. 3A to 3E are cross-sectional schematic views showing a process for producing a semiconductor device in the case where a dicing tape-integrated film for semiconductor back surface 1 is used.

In the process for producing a semiconductor device, the semiconductor device can be produced using the dicing tape-integrated film for semiconductor back surface 1. Specifically, the process includes a step of attaching a semiconductor wafer 4 onto the film for semiconductor back surface 2, a step of dicing the semiconductor wafer 4 to form a semiconductor element, a step of irradiating the pressure-sensitive adhesive layer 32 in the dicing tape-integrated film for semiconductor back surface 1 with a radiation ray from the base material 31 side, a step of peeling the semiconductor element 5 from the pressure-sensitive adhesive layer 32 of the dicing tape 3 together with the film for semiconductor back surface 2, and a step of flip chip-connecting the semiconductor element 5 onto the adherend 6.

(Mounting Step)

Figure 3A:
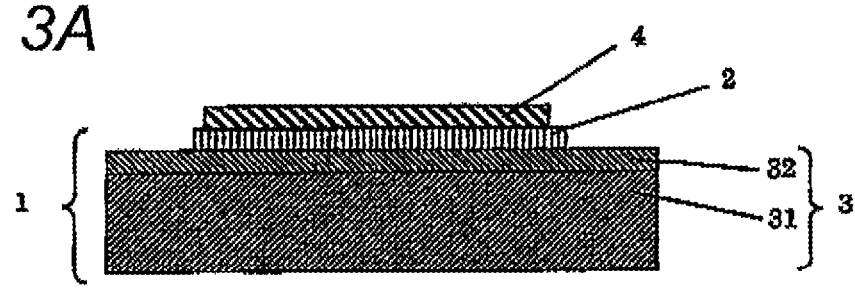
FIGS. 3A to 3E are cross-sectional schematic views showing one embodiment of a process for producing a semiconductor device using a dicing tape-integrated film for semiconductor back surface of the invention.

First, as shown in FIG. 3A, a separator optionally provided on the film for semiconductor back surface 2 of the dicing tape-integrated film for semiconductor back surface 1 is suitably peeled off and the semiconductor wafer 4 is attached onto the film for semiconductor back surface 2 to be fixed by adhesion and holding (mounting step). On this occasion, the film for semiconductor back surface 2 is in an uncured state (including a semi-cured state). Moreover, the dicing tape-integrated film for semiconductor back surface 1 is attached to the back surface of the semiconductor wafer 4. The back surface of the semiconductor wafer 4 means a face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

(Dicing Step)

Figure 3B:
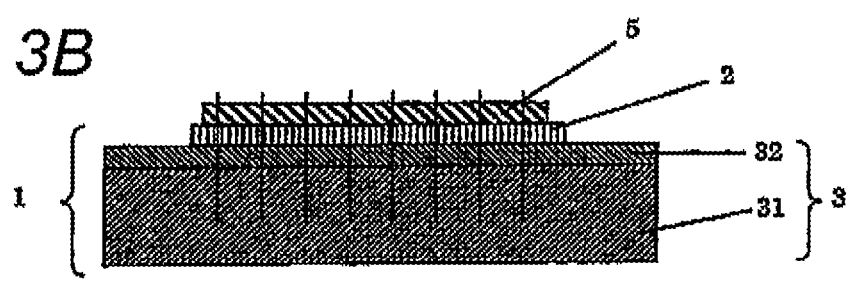

Next, as shown in FIG. 3B, the semiconductor wafer 4 is diced. Thereby, the semiconductor wafer 4 is cut into a prescribed size and individualized (is formed into small pieces) to produce semiconductor chips 5. The dicing is performed according to a normal method from the circuit face side of the semiconductor wafer 4, for example. Moreover, the present step can adopt, for example, a cutting method called full-cut that forms a slit reaching the dicing tape-integrated film for semiconductor back surface 1. The dicing apparatus used in the present step is not particularly restricted, and a conventionally known apparatus can be used. Further, since the semiconductor wafer 4 is cut by rotating a dicing blade or the like at high speed, the cutting is performed with spraying cutting water to the cutting part for cooling and preventing flying of cut swarf. Here, when the pressure-sensitive adhesive layer 32 is not radiation-cured, the close adhesiveness with the film for semiconductor back surface 2 is extremely good, so that the penetration of the cutting water between the both can be surely prevented. Moreover, since the semiconductor wafer 4 is adhered and fixed by the dicing tape-integrated film for semiconductor back surface 1 having the film for semiconductor back surface 2, chip crack and chip fly can be suppressed, as well as the damage of the semiconductor wafer 4 can also be suppressed. In this regard, when the film for semiconductor back surface 2 is formed of a resin composition containing an epoxy resin, generation of adhesive extrusion from the pressure-sensitive adhesive layer of the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

In addition, in the case where the dicing tape-integrated film for semiconductor back surface 1 is expanded, the expansion can be performed using a conventionally known expanding apparatus. The expanding apparatus has a doughnut-shaped outer ring capable of pushing the dicing tape-integrated film for semiconductor back surface 1 downward through a dicing ring and an inner ring which has a diameter smaller than the outer ring and supports the dicing tape-integrated film for semiconductor back surface. Owing to the expanding step, it is possible to prevent the damage of adjacent semiconductor chips through contact with each other in the picking-up step to be mentioned below.

(Irradiation Step with Radiation Ray)

Figure 3C:
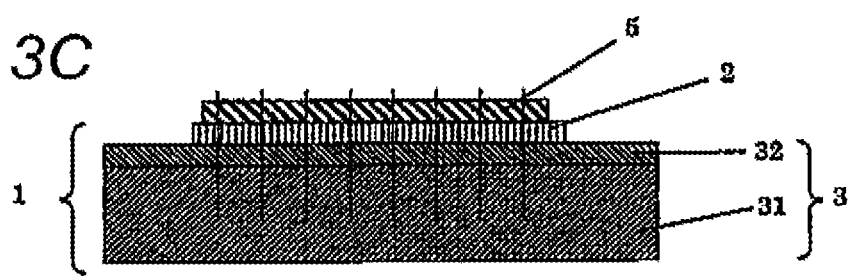

Next, as shown in FIG. 3C, the pressure-sensitive adhesive layer 32 is irradiated with a radiation ray from the base material 31 side. Thereby, the pressure-sensitive adhesive force of the pressure-sensitive adhesive layer 32 toward the film for semiconductor back surface 2 (or 12) can be decreased. The irradiation with a radiation ray may be performed on the whole surface of the pressure-sensitive adhesive layer 32 or on only the part 32a corresponding to the film for semiconductor back surface 2 or the semiconductor wafer-attaching part 12a of the film for semiconductor back surface 12. In the latter case, after all or a portion of the part other than the part corresponding to the film for semiconductor back surface 2 or the semiconductor wafer-attaching part 12a of the film for semiconductor back surface 12 is light-shielded, the irradiation with a radiation ray is performed. As a light-shielding material, one capable of being a photo mask on the supporting film can be prepared by printing, vapor deposition, or the like.

The irradiation with a radiation ray is preferably carried out in the range of 50 mJ/cm$^2$ to 2,000 mJ/cm$^2$, and further preferably in the range of 100 mJ/cm$^2$ to 1,000 mJ/cm$^2$. The irradiation with a radiation at 50 mJ/cm$^2$ or more (particularly, 100 mJ/cm$^2$ or more) makes the curing of the pressure-sensitive adhesive layer 32 sufficient and makes the peeling property from the film for semiconductor back surface 2 (or 12) good. As a result, a good picking-up performance becomes possible and the attachment of the pressure-sensitive adhesive to the film for semiconductor back surface 2 (or 12) after picking-up (so-called adhesive residue) can be prevented. On the other hand, the irradiation with a radiation at 2,000 mJ/cm$^2$ or less (particularly, 1,000 mJ/cm$^2$ or less) can reduce thermal damage to the base material 31. In addition, excessive progress of the curing of the pressure-sensitive adhesive layer 32 to result in too much increase in the tensile elastic modulus and thus decrease in the expanding property can be prevented. Incidentally, as the radiation ray, an X-ray, UV ray, electron beam, and the like may be mentioned.

Incidentally, in the embodiment shown by FIGS. 3A to 3E, although the irradiation step with a radiation ray is a step between the dicing step and the picking-up step, it may be performed at any stage (e.g., before the mounting step, between the mounting step and the dicing step, or the like) as long as it is performed before the picking-up step.

(Picking-Up Step)

Figure 3D:
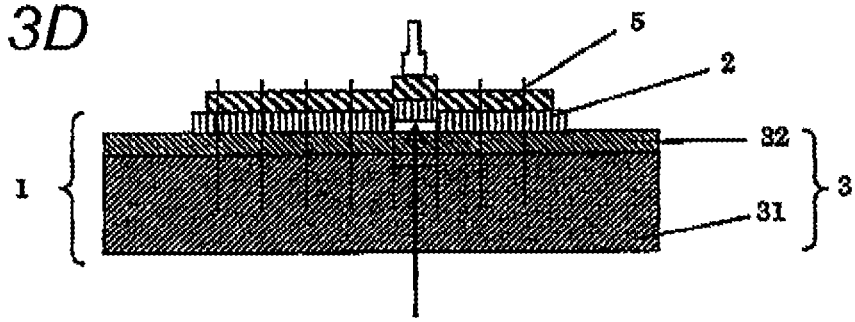

In order to collect the semiconductor chip 5 that is adhered and fixed to the dicing tape-integrated film for semiconductor back surface 1, picking-up of the semiconductor chip 5 is performed as shown in FIG. 3D to peel the semiconductor chip 5 together with the film for semiconductor back surface 2 from the dicing tape 3. The method of picking-up is not particularly restricted, and conventionally known various methods can be adopted. For example, there may be mentioned a method including pushing up each semiconductor chip 5 from the base material 31 side of the dicing tape-integrated film for semiconductor back surface 1 with a needle and picking-up the pushed semiconductor chip 5 with a picking-up apparatus. However, in the invention, since the pressure-sensitive adhesive layer 32 has been cured beforehand by irradiation with a radiation ray, irradiation of the pressure-sensitive adhesive layer 32 with a radiation ray is not performed. In this regard, the back surface of the picked-up semiconductor chip 5 is protected with the film for semiconductor back surface 2.

(Flip Chip Connection Step)

Figure 3E:
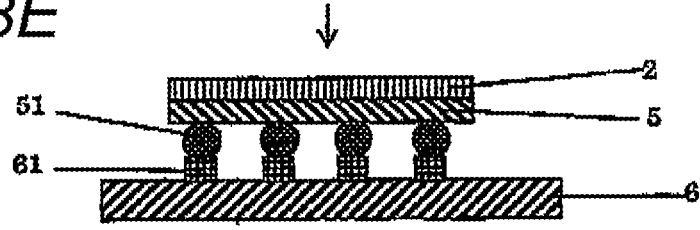

The picked-up semiconductor chip 5 is fixed to an adherend 6 such as a substrate by a flip chip bonding method (flip chip mounting method) as shown in FIG. 3E. Specifically, the semiconductor chip 5 is fixed to the adherend 6 according to a usual manner in a form where the circuit face (also referred to as a front face, circuit pattern-formed face, electrode-formed face, etc.) of the semiconductor chip 5 is opposed to the adherend 6. For example, the bump 51 formed at the circuit face side of the semiconductor chip 5 is brought into contact with a conductive material 61 (such as solder) for conjunction attached to a connecting pad of the adherend 6 and the conductive material 61 is melted under pressing, whereby electric connection between the semiconductor chip 5 and the adherend 6 can be secured and the semiconductor chip 5 can be fixed to the adherend 6 (flip chip bonding step). On this occasion, gaps are formed between the semiconductor chip 5 and the adherend 6 and the distance between the gaps is generally about 30 µm to 300 µm. In this regard, after the flip chip bonding of the semiconductor chip 5 on the adherend 6, it is important that the opposing faces of the semiconductor chip 5 and the adherend 6 and the gaps are washed and an encapsulating material (such as an encapsulating resin) is then filled into the gaps to perform encapsulation.

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step (flip chip connection step), the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The dicing tape-integrated film for semiconductor back surface of the invention can be made to have thermal resistance capable of enduring the high temperature in the flip chip bonding step by forming the film for semiconductor back surface with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The film for semiconductor back surface in the dicing tape-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

Next, an encapsulation step is performed for encapsulating the gaps between the flip chip-bonded semiconductor chip 5 and the adherend 6. The encapsulation step is performed using an encapsulating resin. The encapsulation conditions on this occasion are not particularly restricted but the curing of the encapsulating resin is usually carried out at 175° C. for 60 seconds to 90 seconds. However, in the invention, without limitation thereto, the curing may be performed at a temperature of 165 to 185° C. for several minutes, for example. By the thermal treatment in this step, the encapsulating resin is cured as the thermal curing proceeds. Moreover, by the step, film for semiconductor back surface 2 can be completely or almost completely cured and can be attached to the back surface of the semiconductor element with excellent close adhesiveness. Further, the film for semiconductor back surface 2 according to the invention can be thermally cured together with the encapsulating material at the encapsulation step even when the film is in an uncured state, so that it is not necessary to newly add a step for thermal curing of the film for semiconductor back surface 2.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

According to the semiconductor device (flip chip-mounted semiconductor device) manufactured using the dicing tape-integrated film for semiconductor back surface 1 and the film for semiconductor back surface, the film for semiconductor back surface is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the semiconductor device produced using the dicing tape-integrated film for semiconductor back surface 1 of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the invention is not limited to the following Examples unless it exceeds the gist thereof. Moreover, part in each example is a weight standard unless otherwise stated.

Example 1

Preparation of Dicing Tape

In a reaction vessel fitted with a cooling tube, a nitrogen inlet tube, a thermometer, and a stirring apparatus were placed 86.4 parts of 2-ethylhexyl acrylate (hereinafter also referred to as "2EHA"), 13.6 parts of 2-hydroxyethyl acrylate (hereinafter also referred to as "HEA"), 0.2 part of benzoyl peroxide, and 65 parts of toluene, and the whole was subjected to a polymerization treatment in a nitrogen stream at 61° C. for 6 hours to obtain an acrylic polymer A.

To the acrylic polymer A was added 14.6 parts of 2-methacryloyloxyethyl isocyanate (hereinafter also referred to as "MOI"), and the whole was subjected to an addition reaction treatment in an air stream at 50° C. for 48 hours to obtain an acrylic polymer A'.

Then, 2 parts of a polyisocyanate compound (a trade name "COLONATE L", manufactured by Nippon Polyurethane Industry Co., Ltd.) and 5 parts of a photopolymerization initiator (a trade name "IRGACURE 651", manufactured by Ciba Specialty Chemicals) were added to 100 parts of the acrylic polymer A' to obtain a pressure-sensitive adhesive composition solution A.

The pressure-sensitive adhesive composition solution A was applied onto a silicone-treated face of a PET release liner, and then dried at 120° C. for 2 minutes to form a pressure-sensitive adhesive layer having a thickness of 10 μm. Then, a polyolefin film was attached onto the formed pressure-sensitive adhesive layer. The polyolefin film has a thickness of 100 μm and comprises a printed layer for shielding a radiation ray previously formed on a part corresponding to a frame-attaching region. Thereafter, the polyolefin film-attached one was heated at 50° C. for 24 hours to perform a crosslinking treatment, thereby preparing a tape A for chip holding.

<Preparation of Film for Flip Chip Type Semiconductor Back Surface>

113 parts of an epoxy resin (a trade name "EPICOAT 1004" manufactured by JER Co., Ltd.), 121 parts of a phenol resin (a trade name "MILEX XLC-4L" manufactured by Mitsui Chemicals, Inc.), 246 parts of sphere silica (a trade name "SO-25R" manufactured by Admatechs Co., Ltd.), 5 parts of Dye 1 (a trade name "OIL GREEN 502" manufactured by Orient Chemical Industries Co., Ltd.), and 5 parts of Dye 2 (a trade name "OIL BLACK BS" manufactured by Orient Chemical Industries Co., Ltd.) based on 100 parts of an acrylic acid ester-based polymer (a trade name "PARACRON W-197CM" manufactured by Negami Chemical Industrial Co., Ltd.) containing ethyl acrylate and methyl methacrylate as main components were dissolved in methyl ethyl ketone to prepare a solution of a resin composition having a solid concentration of 23.6% by weight.

The solution of the resin composition was applied onto a releasably treated film, as a release liner (separator), composed of a polyethylene terephthalate film having a thickness of 50 μm, which had been subjected to a silicone-releasing treatment, and then dried at 130° C. for 2 minutes to prepare a film for flip chip type semiconductor back surface having a thickness (average thickness) of 20 μm.

<Preparation of Dicing Tape-Integrated Film for Semiconductor Back Surface>

The foregoing film for semiconductor back surface was attached onto the pressure-sensitive adhesive layer of the dicing tape using a laminator to prepare a dicing tape-integrated film for semiconductor back surface. In this regard, the conditions of the laminator are as follows.

<Laminator Conditions>
Laminator apparatus: LPA330/450
Laminator temperature: 40° C.
Laminator speed: 1,600 mm/min Comparative Example 1

Preparation of Dicing Tape

A dicing tape was prepared in the same manner as in Example 1. Thereafter, only a part (diameter: 220 mm) of the pressure-sensitive adhesive layer corresponding to the semiconductor wafer-attaching part (diameter: 200 mm) was directly irradiated with a UV ray to achieve UV curing. Thereby, a dicing tape according to the present Comparative Example was prepared. The irradiation conditions of the UV ray were as follows.

<Irradiation Conditions of UV Ray>
UV irradiation apparatus: high-pressure mercury lamp
UV irradiation integrated light quantity: 500 mJ/cm$^2$
Output: 75 W
Irradiation intensity: 150 mW/cm$^2$ <Preparation of Film for Flip Chip Type Semiconductor Back Surface>

A film for flip chip type semiconductor back surface is prepared in the same manner as in Example 1.

<Preparation of Dicing Tape-Integrated Film for Semiconductor Back Surface>

The foregoing film for flip chip type semiconductor back surface was attached onto the pressure-sensitive adhesive layer of the dicing tape using a laminator to prepare a dicing tape-integrated film for semiconductor back surface.

(Evaluation)

With regard to the dicing tape-integrated films for semiconductor back surfaces prepared in Example 1 and Comparative Example 1, a dicing property and a picking-up property were evaluated or measured by the following methods. The results of the evaluation or measurement are also shown in Table 1.

<Evaluating Method of Dicing Property>

Using the dicing tape-integrated films for semiconductor back surfaces of Example 1 and Comparative Example 1, the dicing property was evaluated by actually dicing a semiconductor wafer. Namely, the presence of occurrence of chip fly and chipping of a semiconductor chip and the presence of penetration of cutting water were evaluated.

First, a semiconductor wafer (diameter: 8 inches, thickness: 0.6 mm; a silicon mirror wafer) was subjected to a back surface polishing treatment and a mirror wafer having a thickness of 0.2 mm was used as a workpiece. After the separator was peeled from the dicing tape-integrated film for semiconductor back surface, the mirror wafer (diameter: 8 inches, thickness: 200 μm; a silicon mirror wafer) was attached onto the film for semiconductor back surface by roller press-bonding at 70° C. Further, dicing of the mirror wafer was performed. The dicing was performed as full cut so as to be a chip size of 1.0 mm square. In this regard, attaching conditions and dicing conditions are as follows.

(Conditions for Semiconductor Wafer Grinding)
Grinding apparatus: a trade name "DFG-8560" manufactured by DISCO Corporation
Semiconductor wafer: 8 inch diameter (back surface was ground so as to be until a thickness of 0.2 mm from a thickness of 0.6 mm)

(Attaching Conditions)
Attaching apparatus: a trade name "MA-3000III" manufactured by Nitto Seiki Co., Ltd.
Attaching speed: 10 mm/min
Attaching pressure: 0.15 MPa
Stage temperature at the time of attaching: 70° C.

(Dicing Conditions)
Dicing apparatus: a trade name "DFD-6361" manufactured by DISCO Corporation
Dicing ring: "2-8-1" (manufactured by DISCO Corporation)
Dicing speed: 30 mm/sec
Dicing Blade:
Z1; "203O-SE 27HCDD" manufactured by DISCO Corporation
Z2; "203O-SE 27HCBB" manufactured by DISCO Corporation
Dicing Blade Rotation Speed:
Z1; 40,000 r/min
Z2; 45,000 r/min
Cutting method: step cutting
Wafer chip size: 1.0 mm square
Feed of cutting water: 2.0 L/min (Evaluation Standard of Chip Fly and Water Penetration at Dicing)

The presence of penetration of the cutting water at dicing was observed from the base material side of the dicing tape. The case where the cutting water was not confirmed between the pressure-sensitive adhesive layer and the film for semiconductor back surface was ranked "Good" and the case where the penetration was confirmed was ranked "Poor". Moreover, with regard to the chip fly, when 50 pieces of semiconductor chips were formed by dicing a semiconductor wafer, the case where the number of occurrence of chip fly was 5 pieces or less was ranked "Good" and the case where the number was more than 5 pieces was ranked "Poor".

(Evaluation Standard of Chipping at Dicing)

50 pieces of the semiconductor chips prepared by the dicing were collected and the last cut faces among the lateral faces of these semiconductor chips were observed. The depth of chip crack (chipping) was measured on all the chips and the deepest one was taken as a degree of chipping in the semiconductor chips The case where chipping having a degree of chipping reaching a half or more of the thickness of the semiconductor chip occurred, that is, the case where the value was 100 μm or more was ranked "Poor", while the case where the maximum value was less than 100 μm was ranked as "Good".

<Evaluating Method of Picking-Up Property>

Next, picking-up of the semiconductor chip was performed. The picking-up was performed after irradiation of the pressure-sensitive adhesive layer with a UV ray. The irradiation conditions are as follows. After the UV irradiation, the semiconductor chip obtained by dicing was picked up from the pressure-sensitive adhesive layer together with the film for flip chip type semiconductor back surface by pushing up the chip from the dicing tape side of the dicing tape-integrated film for semiconductor back surface with a needle. The picking-up success ratio (%) of the semiconductor chips (400 pieces in total) on this occasion was determined to evaluate the picking-up property. Therefore, the picking-up property is better when the picking-up ratio is closer to 100%. In this regard, the picking-up conditions are as follows.

<Irradiation Conditions of UV Ray>
UV irradiation apparatus: high-pressure mercury lamp
UV irradiation integrated light quantity: 500 mJ/cm$^2$
Output: 75 W
Irradiation intensity: 150 mW/cm$^2$
Incidentally, UV irradiation was performed from the base material side of the dicing tape.

(Picking-Up Conditions)
Picking-up apparatus: a trade name "SPA-300" manufactured by Shinkawa Co., Ltd.
Number of picking-up needles: 1 needle
Pushing-up speed of needle: 20 mm/s
Pushing-up distance of needle: 500 μm
Picking-up time: 1 second
Dicing tape-expanding amount: 3 mm

TABLE 1

|  | Presence of penetration of cutting water | Presence of chip fly | Presence of chipping | Picking-up success ratio (%) |
|---|---|---|---|---|
| Example 1 | Good | Good | Good | 100% |
| Comparative Example 1 | Poor | Poor | Poor | 100% |

(Results)

As seen from Table 1, with regard to the dicing tape-integrated film for semiconductor back surface according to Example 1, the penetration of cutting water between the pressure-sensitive adhesive layer and the film for flip chip type semiconductor back surface is not confirmed. In addition, it is confirmed that the occurrence of chip fly and chipping can be reduced. Furthermore, the picking-up property is also good. On the other hand, with regard to the dicing tape-integrated film for semiconductor back surface according to Comparative Example 1, the penetration of cutting water between the pressure-sensitive adhesive layer and the film for flip chip type semiconductor back surface is confirmed. Also, the chip fly and chipping occur.

While the present invention has been described in detail and with reference to specific embodiments thereof, it will be apparent to one skilled in the art that various changes and modifications can be made therein without departing from the scope thereof.

This application is based on Japanese patent application No. 2010-096295 filed Apr. 19, 2010, the entire contents thereof being hereby incorporated by reference.

What is claimed is:

1. A dicing tape-integrated film for semiconductor back surface, comprising a film for flip chip type semiconductor back surface for protecting a back surface of a semiconductor element flip chip-connected onto an adherend, and a dicing tape, the dicing tape comprising a base material and a pressure-sensitive adhesive layer provided on the base material, the film for flip chip type semiconductor back surface being formed on the pressure-sensitive adhesive layer, wherein the pressure-sensitive adhesive layer is a radiation-curable pressure-sensitive adhesive layer whose pressure-sensitive adhesive force toward the film for flip chip type semiconductor back surface is to be decreased by irradiation with a radiation ray, wherein the radiation-curable pressure-sensitive adhesive is an internal-type UV curable pressure-sensitive adhesive in which a polymer having a radically reactive carbon-carbon double bond in an acrylic polymer side chain or main chain is used as the base polymer, or an addition-type radiation-curable pressure-sensitive adhesive in which a UV curable monomer component or oligomer component is blended into an acrylic pressure-sensitive adhesive, wherein the film for flip chip type semiconductor back surface contains a coloring agent, wherein the dicing tape-integrated film for semiconductor back surface satisfies a relation: $r1 < r2 < r3$, where $r1$ is a diameter of a semiconductor wafer; $r2$ is a diameter of a part in the pressure-sensitive adhesive layer, which corresponds to the film for flip chip type semiconductor back surface or a semiconductor wafer-attaching part in the film for flip chip type semiconductor back surface, and $r3$ is a diameter of the film for flip chip type semiconductor back surface or the semiconductor wafer-attaching part in the film for flip chip type semiconductor back surface, and the part in the pressure-sensitive adhesive layer is to be cured.

* * * * *